United States Patent
Potter

(10) Patent No.: US 9,799,217 B1
(45) Date of Patent: Oct. 24, 2017

(54) VEHICLE DETECTOR WITH IMPROVED LOOP OSCILLATOR CIRCUIT

(71) Applicant: Thomas Ray Potter, Reno, NV (US)

(72) Inventor: Thomas Ray Potter, Reno, NV (US)

(73) Assignee: RENO A + E, Reno, NV (US)

( * ) Notice: Subject to any disclaimer, the term of this patent is extended or adjusted under 35 U.S.C. 154(b) by 0 days.

(21) Appl. No.: 15/330,561

(22) Filed: Oct. 11, 2016

(51) Int. Cl.
    *G08G 1/042* (2006.01)
    *H03B 5/24* (2006.01)
    *H03K 5/08* (2006.01)
    *H03G 1/00* (2006.01)

(52) U.S. Cl.
    CPC ............... *G08G 1/042* (2013.01); *H03B 5/24* (2013.01); *H03G 1/0029* (2013.01); *H03K 5/08* (2013.01)

(58) Field of Classification Search
None
See application file for complete search history.

(56) References Cited

U.S. PATENT DOCUMENTS

| | | | | |
|---|---|---|---|---|
| 3,870,990 A | * | 3/1975 | Fathauer | G08G 1/042 340/939 |
| 4,472,706 A | * | 9/1984 | Hodge | G08G 1/042 324/233 |
| 5,198,811 A | * | 3/1993 | Potter | G08G 1/042 340/905 |
| 8,779,942 B1 | * | 7/2014 | Potter | G08G 1/015 340/933 |

* cited by examiner

*Primary Examiner* — Brent Swarthout

(57) ABSTRACT

An oscillator unit for a vehicle detector includes an oscillator circuit for generating vehicle detector loop signals in response to enabling control signals from a vehicle detector control unit, a gain control circuit for maintaining the amplitude of the oscillator output signals within a limited range, and a clamping circuit for eliminating ringing of the oscillator output signals when operation of the oscillator circuit is disabled. The gain control circuit eliminates random amplitude changes in the vehicle detector loop signals generated by the oscillator circuit caused by changing environmental conditions experienced by the vehicle detector loop. The clamping circuit provides immediate clamping of the oscillator circuit operation to eliminate ringing when the control signal switches to the off state. The few additional circuit components which provide the gain control and clamping functions add very little to the overall cost of the oscillator circuit.

7 Claims, 3 Drawing Sheets

VEHICLE DETECTOR WITH IMPROVED LOOP OSCILLATOR CIRCUIT

BACKGROUND OF THE INVENTION

This invention relates to vehicle detector systems used to detect the presence or absence of a motor vehicle over an inductive loop embedded in the pavement. More particularly, this invention relates to a vehicle detector system with an improved loop oscillator circuit Vehicle detectors have been used for a substantial period of time to generate information specifying the presence or absence of a vehicle at a particular location sometimes termed a detection zone. Such detectors have been used at intersections, for example, to supply information used by an associated traffic control unit to control the operation of the traffic signal heads, and have also been used to supply control information used in conjunction with automatic entrance and exit gates in parking lots, garages and buildings. A widely used type of vehicle detector employs the principle of period shift measurement in order to determine the presence or absence of a vehicle in or adjacent to the inductive loop mounted on or in a roadway. In such systems, a first oscillator-termed the loop oscillator-, which typically operates in the range from about 20 kHZ to about 100 kHZ, is used to produce a periodic signal in a vehicle detector loop. A second oscillator operating at a much higher frequency is commonly used to generate a sample count signal over a fixed number of loop oscillator cycles. The relatively high frequency count signal is typically used to increment a counter, which stores a number corresponding to the sample count at the end of the fixed number of loop oscillator cycles. This sample count is compared with a reference count stored in another counter and representative of a previous count in order to determine whether a vehicle has entered or departed the region of the loop in the time period between the previous sample count and the present sample count.

The initial reference value is obtained from one or more initial sample counts and stored in a reference counter. Thereafter, successive sample counts are obtained on a periodic basis, and compared with the reference count. If the two values are essentially equal, the condition of the loop remains unchanged, i.e., a vehicle has not entered or departed the loop. However, if the two numbers differ by at least a threshold amount in a first direction (termed the Call direction), the condition of the loop has changed and may signify that a vehicle has entered the loop. More specifically, in a system in which the sample count has decreased and the sample count has a numerical value less than the reference count by at least a threshold magnitude, this change signifies that the period of the loop oscillator signal has decreased (since fewer counts were accumulated during the fixed number of loop oscillator cycles), which in turn indicates that the frequency of the loop oscillator signal has increased, usually due to the presence of a vehicle in or near the loop. When these conditions exist, the vehicle detector generates a signal termed a Call signal indicating the presence of a vehicle in the loop.

Correspondingly, if the two numbers differ by less than a second threshold amount in a second direction (termed the No Call direction), this condition indicates that a vehicle which was formerly located in or near the loop has departed the detection zone. When this condition occurs, a previously generated Call signal is dropped.

The difference $\Delta N$ between a sample count N and a reference count R is representative of the inductance change in a loop oscillator circuit at the end of the time period between the former sample count (the reference count R) and the current sample count N. More particularly, the quantity $\Delta L/L = k \Delta N/N$, where L=loop inductance and k is a scaling factor, expresses the relationship between numerical counts and loop inductance.

Call signals are used in a wide variety of applications, including vehicle counting along a roadway or through a parking entrance or exit, vehicle speed between preselected points along a roadway, vehicle presence at an intersection controlled by a traffic control light system, or in a parking stall, and numerous other applications.

In addition to the basic function of generating and dropping a Call signal, existing vehicle detectors incorporate other features, some of which are selectable on-site by a technician. For example, some vehicle detectors incorporate an end of green function which requires the detector to automatically reset after the green traffic signal, which controls the lane in which the loop associated with the vehicle detector is located, terminates. Some vehicle detectors are provided with an extension time feature which extends the Call signal for a period of time after a vehicle leaves the associated loop (typically in order to permit ample minimum time for a vehicle to clear an intersection). Some vehicle detectors are also provided with a presence/pulse selection feature, which causes the vehicle detector to generate one of two types of Call signals: a continually persisting signal so long as the vehicle remains in the loop (the presence function); or a fixed length pulse generated when the vehicle is first detected in the loop, or when the vehicle departs the loop (the pulse function). Still other vehicle detectors are provided with selectable different sensitivity settings, which enable a technician to adjust the response of the vehicle detector when connected to the loop in order to accommodate a range of detection conditions.

In the past, vehicle detectors have been designed as either single channel or multiple channel detectors. A single channel detector is designed and configured to operate with only a single loop zone; while a multiple channel vehicle detector is designed and configured to operate with two or more independent loop zones. Multiple channel detectors are designed to be either scanning or non-scanning detectors. A scanning detector operates by sampling only one loop channel at a time, shutting down the active loop, sampling the next loop channel, shutting down that loop, etc. Scanning detectors are typically used in installations in which the probability of cross-talk between loop circuits is more than minimal. Cross talk results when physically adjacent loops are operating at, or near, the same frequency. Cross talk is minimized or eliminated by operating physically adjacent loops on different frequencies. Non-scanning vehicle detectors are configured and function to monitor each of the multiple loop zones simultaneously. Non-scanning detectors are typically used in installations in which there is a very low or no possibility of cross-talk between the multiple loop circuits, such as installations at which the loops are physically separated by a distance sufficient to ensure no overlapping or inter-coupling between the electrical fields associated with the loops. An example of a vehicle detector incorporating the functions described above is disclosed in U.S. Pat. No. 6,087,964 issued Jul. 11, 2000 for "Vehicle Detector With Operational Display", the disclosure of which is hereby incorporated by reference.

When deployed in an intersection controlled by a traffic control light system, vehicle detectors generate signals which are used by the intersection traffic controller to supervise the operational states of the traffic control heads in response to the arrival and departure of vehicles over loops installed in the various lanes leading to the intersection.

A key component of vehicle detectors is the loop oscillator circuit. This circuit includes oscillator components capable of generating the periodic signals noted above, a transformer to which the oscillator components are coupled, and the loop which typically comprises a closed loop of one or more turns embedded in the roadway surface and a pair of electrical conductors connected between the ends of the loop and one side of the transformer. While the oscillator components and the transformer can be mounted to a circuit board housed within a control unit cabinet and thereby somewhat shielded from the outside environment, the loop and the interconnecting electrical conductors of necessity are directly exposed to the outside environment and consequently are directly subject to changes in environmental conditions, such as wide variations in temperature and humidity, as well as mechanical vibrations due to vehicle traffic, construction work, seismic earth movements and the like. These changes have a direct impact on the functional stability of the loop oscillator circuit, which operates in the analog domain. More particularly, changes in environmental conditions can adversely affect the amplitude of the loop oscillator circuit to such an extent that one or more loop cycles can be missed by the loop counter, or one or more phantom loop cycles can be erroneously counted by the loop counter. In either case, the resulting accumulated sample count will not accurately reflect whether or not the status of the loop circuit has actually changed, and the vehicle detector may erroneously generate a false Call signal or erroneously drop an existing Call signal. Known vehicle detector oscillator circuits are not designed to compensate for this severe disadvantage.

Known vehicle detector oscillator circuits suffer from an additional disadvantage. In many intersections where vehicle detector oscillator circuits are deployed there are oscillator loops located in adjacent vehicle lanes, each connected to individual oscillator circuits which function independently of each other. When the operation of a given oscillator circuit is terminated at the end of a sampling period, that oscillator circuit does not cease generating a loop oscillator signal immediately, but continues to resonate for a few cycles due to a phenomenon known as "ringing". This "ringing" phenomenon can carry over to the oscillator circuits in adjacent vehicle lanes by virtue of cross-talk between the ringing oscillator circuit and the adjacent lane oscillator circuits, which interferes with their operation and can cause erroneous results in those signals.

SUMMARY OF THE INVENTION

The invention comprises an improved oscillator circuit for use in a vehicle detector system which is devoid of the disadvantages noted above with known vehicle detector oscillator circuits and which adds no appreciable cost to an oscillator circuit.

In a broadest aspect, the invention comprises a vehicle detector oscillator unit comprising a power terminal adapted to be coupled to a D.C. electrical power source; a ground terminal adapted to be coupled to an electrical ground source; an oscillator circuit adapted to be coupled to a loop, the oscillator circuit including a control input terminal for receiving a control signal from a control device for enabling and disabling operation of the oscillator circuit and an output terminal for manifesting oscillator output signals; a gain control circuit coupled to the oscillator circuit for maintaining the amplitude of the oscillator output signals within a limited range; and a clamping circuit for eliminating ringing of the oscillator output signals when operation of the oscillator circuit is disabled.

The oscillator circuit includes an oscillator transistor having a first terminal coupled to the output terminal and a second terminal; and the gain control circuit includes a biasing network coupled between the power terminal and the output terminal, the biasing network having an intermediate junction, and a transistor having a first terminal coupled to the second terminal of the oscillator transistor, a second terminal coupled to the ground terminal, and a gate terminal coupled to the intermediate junction. The biasing network further includes a pair of resistors connected in series, and the intermediate junction comprises the connection between the pair of resistors. The biasing network further includes a diode-preferably a Schottky diode-having an anode coupled to one of the pair of resistors and a cathode coupled to the output terminal.

The clamping circuit includes a first switching transistor having a first terminal coupled to the power terminal, a second terminal coupled to the output terminal, and a gate terminal, a second switching transistor having a first terminal coupled to the power terminal, a second terminal coupled to the ground terminal, and a gate terminal coupled to the control input terminal, and a third switching transistor having a first terminal coupled to the gate terminal of the first switching transistor, a second terminal coupled to the ground terminal, and a gate terminal coupled to the first terminal of the second switching transistor so that the third switching transistor is held in an off state when the control signal is at an enabling state for the oscillator circuit thereby holding the first switching transistor in an off state and the third switching transistor is held in an on state when the control signal is at a disabling state for the oscillator circuit thereby holding the first switching transistor in an on state to clamp the power terminal to the output terminal. The clamping circuit further includes a diode-preferably a Schottky diode-having an anode coupled to the output terminal and a cathode coupled to the gate terminal of the first switching transistor.

The invention provides both gain control for the oscillator circuit when the oscillator circuit is enabled by the control signal from the control device, and also provides immediate clamping of the oscillator circuit operation when the control signal from the control device switches to the off state. The few additional circuit components which provide the gain control and clamping functions add very little to the overall cost of the oscillator circuit.

For a fuller understanding of the nature and advantages of the invention, reference should be made to the ensuing detailed description taken in conjunction with the accompanying drawings.

DETAILED DESCRIPTION OF THE PREFERRED EMBODIMENTS

Figure 1:
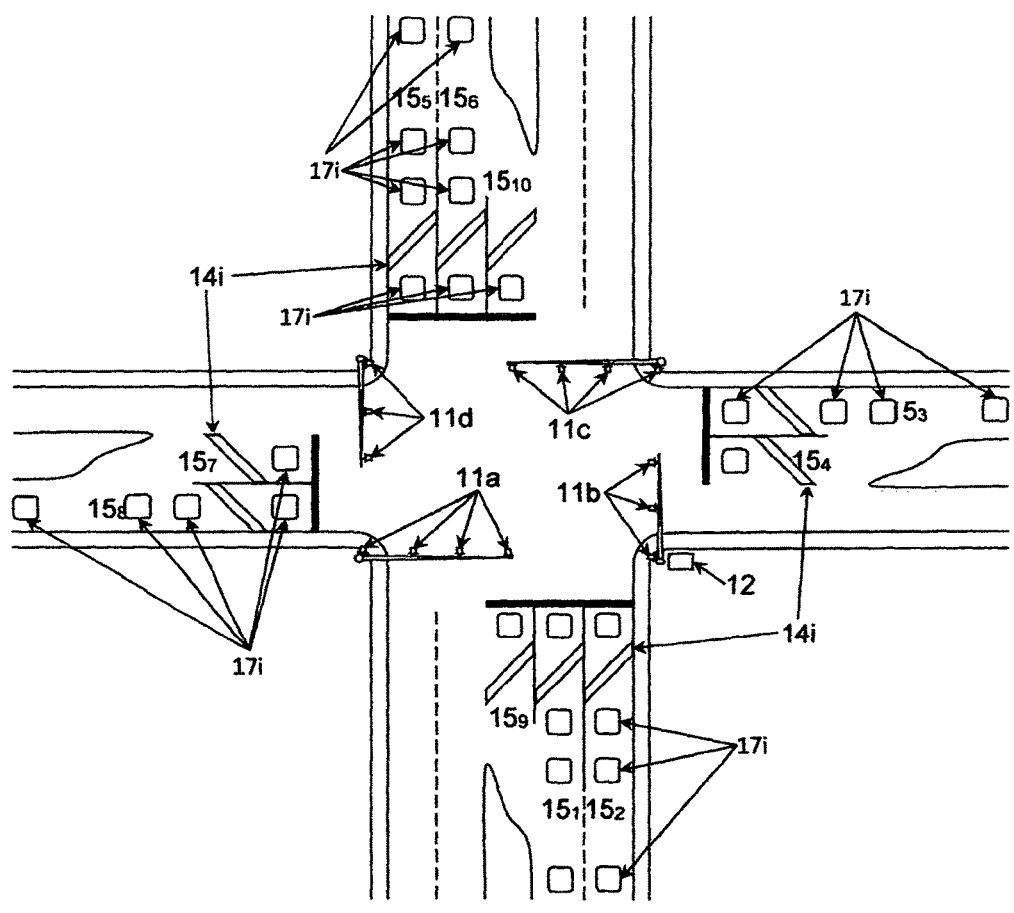
FIG. 1 is a schematic aerial view of a controlled 4-way intersection.

Turning now to the drawings, FIG. 1 is a schematic aerial view of a controlled 4-way vehicle traffic intersection. The intersection is provided with four sets of control heads 11a-11d each containing the usual traffic lights for providing red, amber, and green traffic control signals for oncoming vehicles. The operation of each set of control heads is under the supervision of a standard traffic controller 12 mounted in a cabinet located at a convenient intersection location. The traffic controller 12 has a plurality of output circuits for driving the individual traffic lights comprising each set of control heads 11a-11d. A plurality of vehicle detectors (not illustrated) is located in the same cabinet as traffic controller 12 and each vehicle detector provides motorized vehicle CALL signals to traffic controller 12 in the manner described below. Each vehicle detector is coupled to one or more vehicle detector loops 14i located in the various lanes leading to the intersection. In the preferred embodiment, loops 14i are located in a position upstream from the intersection. Some of the loops 14i are located in through-only lanes-such as lanes 15-1-15-8; other loops are located in left turn only lanes-such as lanes 15-9, 15-10. Other conventional loops 17i are also installed in lanes leading to the intersection. Loops 17i are connected to other vehicle detectors which are also configured to detect motorized vehicles. It is understood that the intersection depicted in FIG. 1 is by way of example only, and that other intersections having different lane configurations are contemplated. What is essential is the inclusion of at least one vehicle detector loop in any lane having a corresponding control head.

In any given lane at any given time, a motorized vehicle may pass over the vehicle detector loop 14i in that lane. Each such vehicle is detected by the corresponding vehicle detector for that lane so that the appropriate control signals can be furnished to the intersection traffic controller 12.

Figure 2:
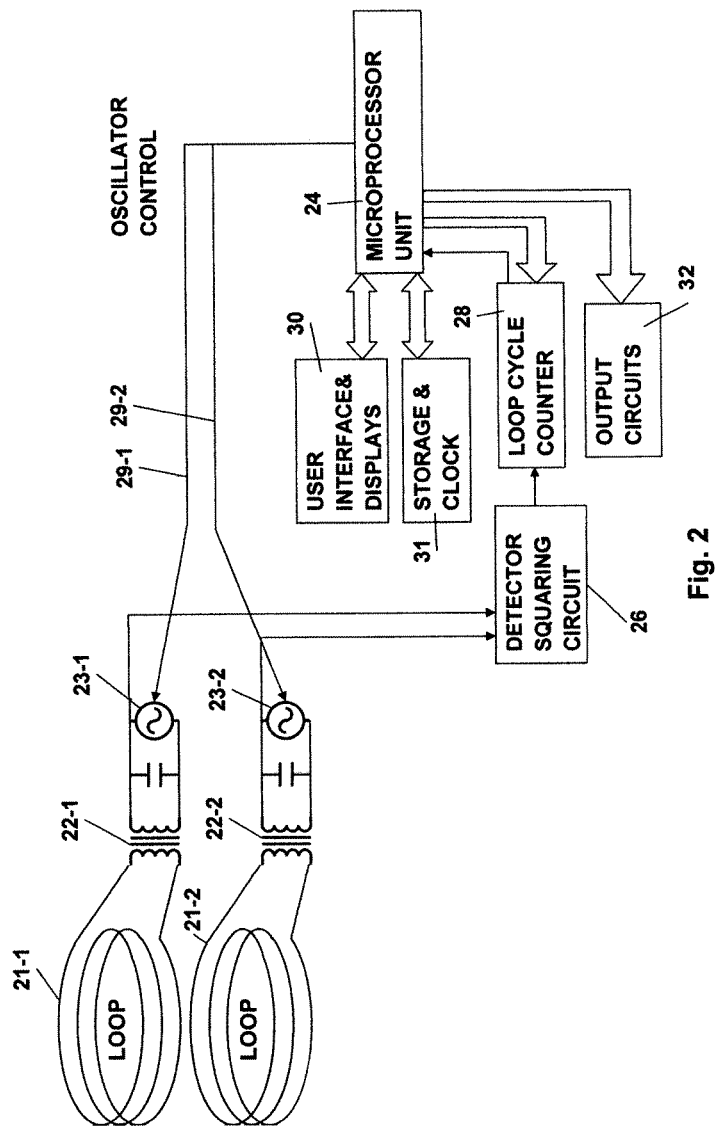
FIG. 2 is a block diagram of an embodiment of a vehicle detector incorporating the improved oscillator unit.
Figure 3:
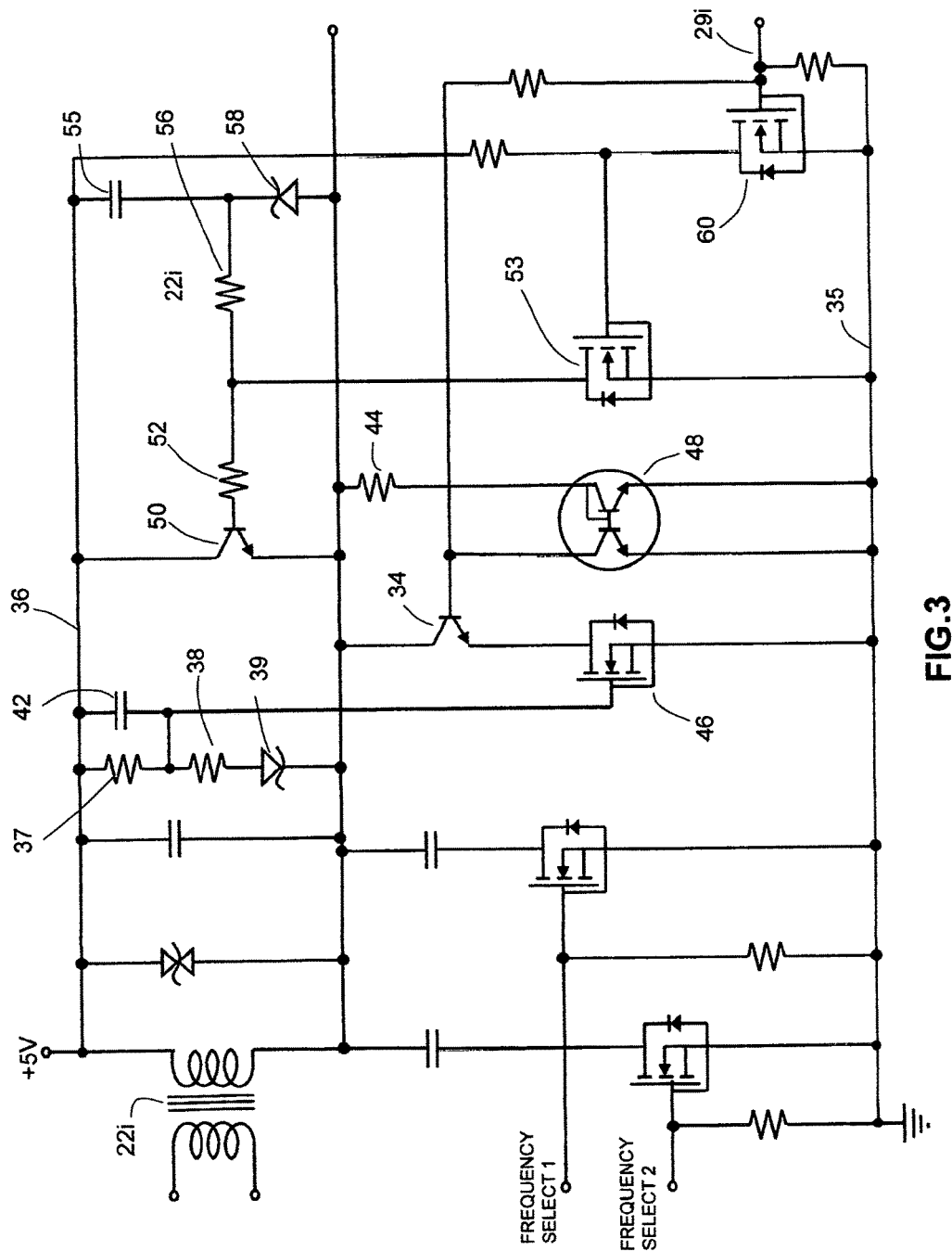
FIG. 3 is a circuit diagram of the improved oscillator unit according to the invention.

FIG. 2 is a block diagram of a preferred embodiment of a two channel vehicle detector incorporating the invention, while FIG. 3 is a circuit diagram of the oscillator circuit according to the invention and used in the vehicle detector illustrated in block diagram form in FIG. 2. While FIG. 2 illustrates only two channels, it is understood that the number of channels may be greater than two, or the vehicle detector may be a single channel detector. Consequently, where appropriate the elements described below are referenced with the designation "i", where "i" is an integer. As seen in FIG. 2, each loop antenna 21i is coupled via an isolation transformer 22i to an oscillator unit 23i shown in FIG. 3 having a plurality of capacitors (only one illustrated in FIG. 2—multiple capacitors illustrated in FIG. 3) for setting the nominal frequency of the oscillator unit 23i. In the preferred embodiment two of the capacitors are selectable by means of FET switches under control of a microprocessor 24. Microprocessor 24 is preferably a type 17C756A unit available from Microchip Technology, Inc of Chandler, Ariz. USA. The operational state of each oscillator unit 23i is controlled by a control signal generated by microprocessor unit 24 on a dedicated control line 29i: when at a first voltage level the control signal present on control line 29i turns on the corresponding oscillator unit 23i; when at a second voltage level the control signal present on dedicated control line 29i turns off the corresponding oscillator unit 23i. The frequency of each oscillator unit 23i is dependent in part upon the inductance presented thereto, which is dependent in part upon the presence or absence of a motorized vehicle in the vicinity of the corresponding loop antenna 21i. The output of each oscillator unit 23i is coupled to a detector signal squaring circuit 26, the output of which is coupled to the input of a loop cycle counter 28. Loop cycle counter 28 is implemented in microprocessor 24 using an appropriate known program.

In operation in the vehicle detector mode, each oscillator unit 23i, which typically operates in the range from about 20 kHZ to about 100 kHZ, produces a periodic signal in the circuit containing the corresponding loop antenna 21i. A second oscillator implemented in microprocessor 24 operating at a much higher frequency generates a sample count signal over a fixed number of loop cycles which are counted by the loop cycle counter 28. The relatively high frequency count signal is typically used to increment a counter configured in microprocessor 24, which stores a number corresponding to the sample count at the end of the fixed number of loop cycles. This sample count is compared with a reference count stored in another counter configured in microprocessor 24 and representative of a previous count in order to determine whether a motorized vehicle has entered or departed the region of the corresponding loop 21i in the time period between the previous sample count and the present sample count.

The initial reference value is obtained from one or more initial sample counts and stored in a reference counter. Thereafter, successive sample counts are obtained on a periodic basis, and compared with the reference count. If the two values are essentially equal, the condition of the loop 21i remains unchanged, i.e., a motorized vehicle has not entered or departed the corresponding loop 21i. However, if the two numbers differ by at least a threshold amount in a first direction (termed the Call direction), the condition of the corresponding loop 21i has changed and may signify that a motorized vehicle has entered the corresponding loop 21i. More specifically, in a system in which the sample count has decreased and the sample count has a numerical value less than the reference count by at least a threshold magnitude, this change signifies that the period of the loop oscillator signal has decreased (since fewer counts were accumulated during the fixed number of loop cycles), which in turn indicates that the frequency of the loop oscillator signal has increased, usually due to the presence of a motorized vehicle in or near the corresponding loop 21i. When these conditions exist, the vehicle detector generates a signal termed a Call signal indicating the presence of a motorized vehicle in the loop 21i, and this signal is coupled to the traffic controller 12 via the output circuits block 32.

Correspondingly, if the difference between a sample count and the reference count is less than a second threshold amount, this condition indicates that a motorized vehicle which was formerly located in or near the loop 21i has departed the detection zone. When this condition occurs, a previously generated Call signal is dropped.

During installation of a vehicle detector incorporating the invention at an intersection such as that depicted in FIG. 1, the installation technician will normally perform an initial set up using push switches and displays incorporated into element 30 of the vehicle detector (FIG. 2). Element 30 is described in detail in the above-referenced '964 U.S. patent and includes push button switches, and an LCD display having seven segment characters, a bar graph, and special symbols. The purpose of the initial set up is to tailor the operation of the vehicle detector to the particular requirements of a given intersection.

FIG. 3 is a circuit diagram of the oscillator unit 23 according to the invention, which comprises a standard current mirror/oscillator transistor circuit, a variable gain control circuit, and a clamping circuit.

The standard current mirror/oscillator transistor circuit comprises a transistor 34 coupled between circuit ground 35 and a positive voltage supply line 36 via a charging network including a first resistor 37 (100 Kohms in the preferred embodiment), a second resistor 38 (2.4 Kohms in the preferred embodiment), and a Schottky diode 39, all coupled in series between supply line 36 and an output terminal 40; and a capacitor 42 coupled between supply line 36 and the junction between resistors 37, 38. A current mirror circuit 43 has one branch coupled between output terminal 40 and circuit ground 35 via a resistor 44 and a second branch coupled between circuit ground 35 and the gate of oscillator transistor 34.

Operation of the current mirror/oscillator transistor circuit is controlled by a binary control signal issued by microprocessor unit 24 on a dedicated control line 29$i$: when at a first voltage level the control signal present on control line 29$i$ turns on the corresponding oscillator unit 23$i$; when at a second voltage level the control signal present on dedicated control line 29$i$ turns off the corresponding oscillator unit 23$i$.

The variable gain control comprises a FET transistor 46, preferably a type 2N7002 FET transistor, coupled between the emitter of oscillator transistor 34 and circuit ground 35. The gate of FET transistor 46 is coupled to the junction between resistors 37, 38. FET transistor 46 operates over its linear range so that the resistance between the emitter of oscillator transistor 34 and circuit ground 35 varies in a linear manner as the voltage at the junction between resistors 37, 38 varies between supply voltage and ground. Specifically, the higher the voltage present at the gate of FET transistor 46, the lower the resistance between the emitter of oscillator transistor 34 and circuit ground 35 and the higher the gain of oscillator transistor 34. This compensates for any unpredictable changes in the amplitude of the loop oscillator circuit due to adverse environmental conditions.

The clamping circuit comprises a switching transistor 50, preferably a type 2N4403 transistor, coupled between voltage supply line 36 and output terminal 40; a gate biasing resistor 52, preferably a 10K ohm resistor, coupled between the gate of transistor 50 and one terminal of a FET control transistor 53, preferably a type 2N7002 FET transistor; an R-C network consisting of a capacitor 55, preferably a 1000 picofarad capacitor, and a resistor 56, preferably a 100 K ohm resistor intercoupled as shown; a Schottky diode 58 and FET control transistor 53. The switching terminals of FET control transistor 53 are coupled between gate biasing resistor 52 and circuit ground 35. The gate terminal of FET control transistor 53 is coupled to one switching terminal of an input control FET transistor 60, preferably a type 2N6002 FET transistor—the other switching terminal of input control FET transistor 60 is coupled to circuit ground 35. The gate terminal of input control FET transistor 60 is coupled to dedicated control line 29$i$, which is supplied the circuit control signal from microprocessor 24.

In operation, when the control signal on dedicated control line 29$i$ transitions to a first binary level-which is a High level in the preferred embodiment—input control FET transistor 60 is switched on, which turns FET control transistor 53 off thereby disabling the clamping circuit. Also, oscillator transistor 34 is turned on thereby commencing operation of the oscillator circuit. During operation of the oscillator circuit, the voltage drop across Schottky diode 58 ensures that switching transistor 50 remains in the full off state. During operation of the oscillator circuit, FET transistor 46 regulates the gain of the oscillator circuit to compensate for any unpredictable changes in the amplitude of the loop oscillator circuit due to adverse environmental conditions. After the prescribed number of loop cycles has been counted, microprocessor 24 causes the control signal on dedicated control line 29$i$ to transition to a second binary level-which is a Low level in the preferred embodiment. Input control FET transistor 60 is switched off, which turns FET control transistor 53 on thereby enabling the clamping circuit. When the clamping circuit is enabled, FET control transistor 53 is switched on, which switches on switching transistor 50 thereby clamping voltage supply line 36 to output terminal 49 preventing any ringing in the oscillator circuit.

As will now be apparent, vehicle detectors incorporating the oscillator circuit according to the invention provide both gain control for the oscillator circuit when the oscillator circuit is enabled by the control signal from microprocessor unit 24, and also provides immediate clamping of the oscillator circuit operation when the control signal from microprocessor unit 24 switches to the off state. The few additional circuit components which provide the gain control and clamping functions add very little to the overall cost of the oscillator circuit.

While the above provides a full and complete disclosure of the preferred embodiments of the invention, various modifications, alternate constructions and equivalents will occur to those skilled in the art. For example, while the invention has been described with reference to a specific microprocessor, different types of microprocessor may be employed, as desired, along with compatible program routines to accomplish the same type of motor vehicle detect operations. Therefore, the above should not be construed as limiting the invention, which is defined by the appended claims.

What is claimed is:

1. A vehicle detector oscillator unit comprising:
a power terminal adapted to be coupled to a D.C. electrical power source;
a ground terminal adapted to be coupled to an electrical ground source;
an oscillator circuit adapted to be coupled to a loop, said oscillator circuit including a control input terminal for receiving a control signal from a control device for enabling and disabling operation of said oscillator circuit, an output terminal for manifesting oscillator output signals, and an oscillator transistor having a first terminal coupled to said output terminal and a second terminal;
a gain control circuit coupled to said oscillator circuit for maintaining the amplitude of said oscillator output signals within a limited range, said gain control circuit including a biasing network coupled between said power terminal and said output terminal, said biasing network having an intermediate junction, and a transistor having a first terminal coupled to said second terminal of said oscillator transistor, a second terminal coupled to said ground terminal, and a gate terminal coupled to said intermediate junction; and
a clamping circuit for eliminating ringing of said oscillator output signals when operation of said oscillator circuit is disabled.

2. The oscillator unit of claim 1 wherein said biasing network includes a pair of resistors connected in series, and wherein said intermediate junction comprises the connection between said pair of resistors.

3. The oscillator unit of claim 2 wherein said biasing network further includes a diode having an anode coupled to one of said pair of resistors and a cathode coupled to said output terminal.

4. The oscillator unit of claim 3 wherein said diode is a Schottky diode.

5. The oscillator unit of claim 1 wherein said clamping circuit includes a first switching transistor having a first terminal coupled to said power terminal, a second terminal coupled to said output terminal, and a gate terminal, a second switching transistor having a first terminal coupled to said power terminal, a second terminal coupled to said ground terminal, and a gate terminal coupled to said control input terminal, and a third switching transistor having a first terminal coupled to said gate terminal of said first switching transistor, a second terminal coupled to said ground terminal, and a gate terminal coupled to said first terminal of said second switching transistor so that said third switching transistor is held in an off state when said control signal is at an enabling state for said oscillator circuit thereby holding said first switching transistor in an off state and said third switching transistor is held in an on state when said control signal is at a disabling state for said oscillator circuit thereby holding said first switching transistor in an on state to clamp said power terminal to said output terminal.

6. The oscillator unit of claim 5 wherein said clamping circuit further includes a diode having an anode coupled to said output terminal and a cathode coupled to said gate terminal of said first switching transistor.

7. The oscillator unit of claim 6 wherein said diode is a Schottky diode.

* * * * *